United States Patent [19]

Nguyen et al.

[11] Patent Number: 5,574,393
[45] Date of Patent: Nov. 12, 1996

[54] APPARATUS AND METHOD FOR IMMEDIATELY STOPPING CLOCKS

[75] Inventors: Quang H. Nguyen, San Jose; Eugene T. Wang, Fremont, both of Calif.

[73] Assignee: Amdahl Corporation, Sunnyvale, Calif.

[21] Appl. No.: 994,772

[22] Filed: Dec. 22, 1992

[51] Int. Cl.$^6$ .................................................. H03L 7/00
[52] U.S. Cl. ........................... 327/142; 327/151; 327/153
[58] Field of Search .................................... 307/269, 480; 328/63, 72; 327/142, 144, 152, 291, 293, 298, 145, 151, 153; 326/93, 96

[56] References Cited

U.S. PATENT DOCUMENTS

| | | | |
|---|---|---|---|
| 4,112,380 | 9/1978 | Thatcher | 328/63 |
| 4,835,728 | 5/1989 | Si et al. | 328/63 |
| 4,855,616 | 8/1989 | Wang et al. | 328/72 |
| 4,876,701 | 10/1989 | Sanner | 328/63 |
| 4,916,697 | 4/1990 | Roche et al. | 371/14 |
| 5,289,138 | 2/1994 | Wang | 327/145 |
| 5,297,276 | 3/1994 | Millar et al. | 395/550 |
| 5,382,850 | 1/1995 | Aldrich et al. | 327/161 |

*Primary Examiner*—David C. Nelms
*Assistant Examiner*—Trong Phan
*Attorney, Agent, or Firm*—Fliesler, Dubb, Meyer & Lovejoy

[57] ABSTRACT

A bypass means is provided for bypassing a system clock disabling signal around a conventional system clock disabling signal processing path to reduce the amount of delay between the occurrence of the disabling signal and a stopping of the system clock.

2 Claims, 2 Drawing Sheets

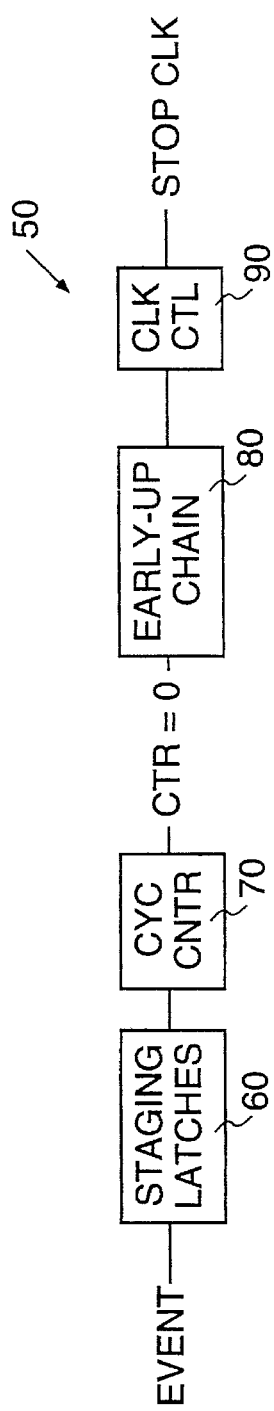
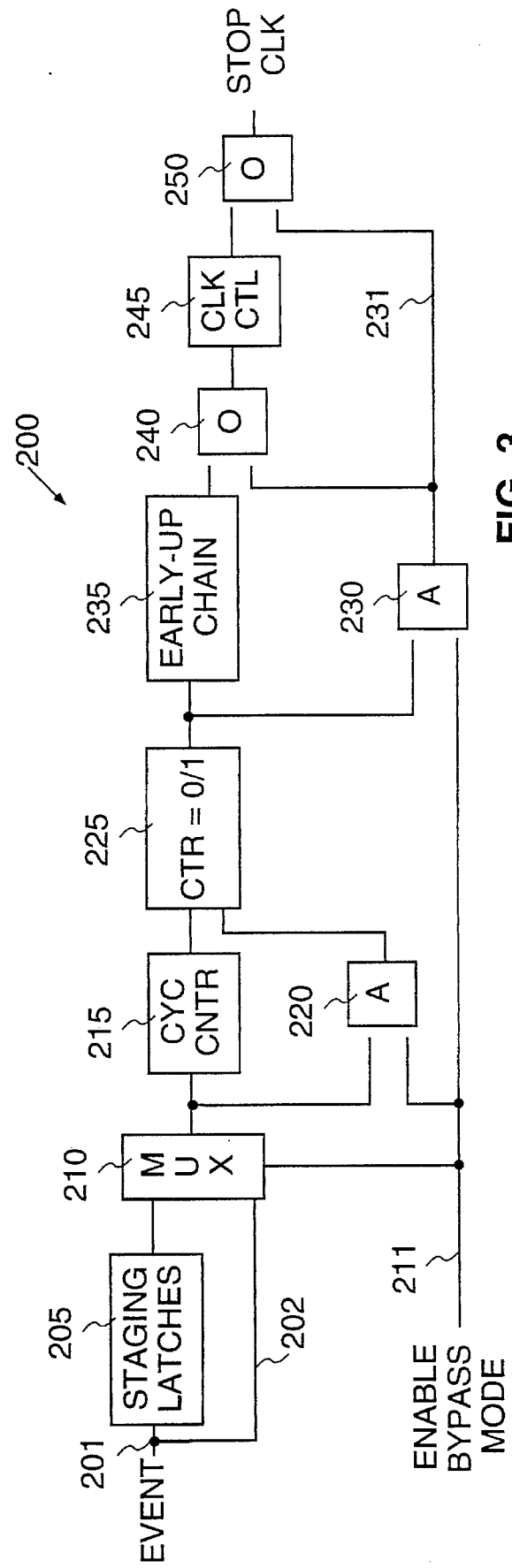

APPARATUS AND METHOD FOR IMMEDIATELY STOPPING CLOCKS

BACKGROUND OF THE INVENTION

1. Technical Field

The present invention relates to data processing systems and, more specifically, to disabling a system clock in such a system.

2. Description of the Related Art

Referring to FIG. 1, a block diagram representing a prior art system clock disabling signal processing circuit is shown. The system clock disabling signal may be generated due to the detection of an error or due to the occurrence of an event trigger. The processing path 50 consists of several groups or blocks of functional logic which includes staging latches 60, a cycle counter 70, an early-up chain 80 and clock control 90.

An event trigger is a signal representing a change of logic state at a particular data location which is responsible for triggering a specific response, such as the issuance of a system clock disable signal. Event triggers are often used in debugging operations. In this context, the occurrence of the event trigger at a predefined data location causes a clocks-off signal to be generated, arresting data propagation, so that interrogation of the machine state after the occurrence of the error may be had.

In normal data processing operations and in prior art debugging operations, a system clock disabling signal, whether coming from an event trigger or a generated error signal, or the like, must necessarily pass through the logic of FIG. 1 which performs the following functions.

The staging latches 60 are generally known in the art and provide the ability to induce a desired delay. For example, if the system clock cycles time is 10 ns and it is desired to have a delay of 100 ns, then 10 latches will be provided in the staging latches 60.

The cycle counter 70 is a mechanism which provides the ability to program which occurrence of an error or event trigger will cause the system clock to be disabled. For example, when a large scale data processing system is initially turned on, it will take some finite amount of time for data processing operations to reach a desired data flow rate. If it is determined, in such an instance, that the arrangement of data in the system for the first ten occurrences of a particular event trigger are not particularly interesting, the cycle counter may be set to count up (or down) ten times and on the eleventh time attain the count which generates a clocks-off signal. In this arrangement, the cycles counter 70 functions as an event trigger screening device.

The early-up chain 80 is essentially a device that transforms a signal with normal timing to a signal with early timing. The transformation takes a fixed number of clock cycles and it is independent of the clock cycle time. The transformation is provided because various units, operating in a data processing system, run on different clock phases to maximize processing speed and it is necessary to transform certain phases so that the system clock stops at an appropriate moment. Clock signals are referred to as early, normal and late, where early clocks have a minus phase shift with respect to the normal clock and late clocks have a plus phase shift with respect to the normal clock.

The clock control block 90 represents that logic which controls clock signals to the machine and which, in response to a clocks-off signal, turns off the system clock. Circuitry for performing the functions of the clock control block 90 is generally known in the art.

In prior art debugging techniques, an event trigger is often used to disable the system clock, whereupon the system is interrogated, eg., by scan-out or probing, or the like, to determine the system state. The use of the above-described functional logic 60, 70, 80, however, in a debugging scenario, induces a significant and disadvantageous delay from the time an error signal occurs to the time the clocks are actually turned off. This delay is approximately 16 cycles in one prior art machine which means that data is propagated for 16 clock cycles after an event occurs and before the disabling of the system clock. It is very difficult to analyze the flow of data for these 16 clock cycles to determine the actual state of the machine at the occurrence the event trigger.

SUMMARY OF THE INVENTION

Accordingly, the present invention is directed to providing a mechanism that permits a rapid disabling of the system clock after the occurrence of a clock disabling signal. The present invention also provides the ability to disable the system clock during the same clock cycle that a disabling signal, such as an event trigger, occurs.

The present invention may be provided in an environment such as that of a data processing system having a plurality of data locations through which data are propagated in system clock cycles in response to a system clock signal. A bypass means is provided for bypassing a system clock disabling signal around a conventional system clock disabling signal processing path to reduce the amount of delay between the occurrence of the disabling signal and a stopping of the system clock. The system clock disabling signal processing circuit is generally synchronous and induces an amount of delay measured by the number of clock cycles needed to pass a disabling signal through to stop the system clocks.

A device for selecting between the disabling signal processing circuit and the bypass mechanism is provided. This selector, which may be a multiplexer, is controlled by the bypass mode enable signal.

A pseudo comparison is performed to determine if a disabling signal input to the bypass mechanism or input to the synchronous processing circuit, is of an appropriate logic state to disable the system clocks. Combinational logic to perform this function may be provided individually for both the bypass mechanism and synchronous processing circuit or in combination.

In one embodiment, the system clock speed is reduced such that the system clock cycle time is greater than the longest propagation delay from the occurrence of the event trigger to arrival at the system clocks of the machine. If the cycle time is at least 2 times greater than the longest propagation delay, the system clock is assured of being disabled during the same clock cycle as the event trigger. In this case, the event trigger is propagated asynchronously to stop system clocks.

The synchronous logic provided in a system clock disabling signal processing circuit includes such circuitry as staging latches, a cycle counter, an early up mechanism, and clock control.

BRIEF DESCRIPTION OF THE DRAWINGS

FIG. 1 is a block diagram representative of a prior art system clock disabling signal processing circuit.

FIG. 3 is a block/schematic diagram of a system clock disabling signal processing circuit.

DETAILED DESCRIPTION

Figure 2:
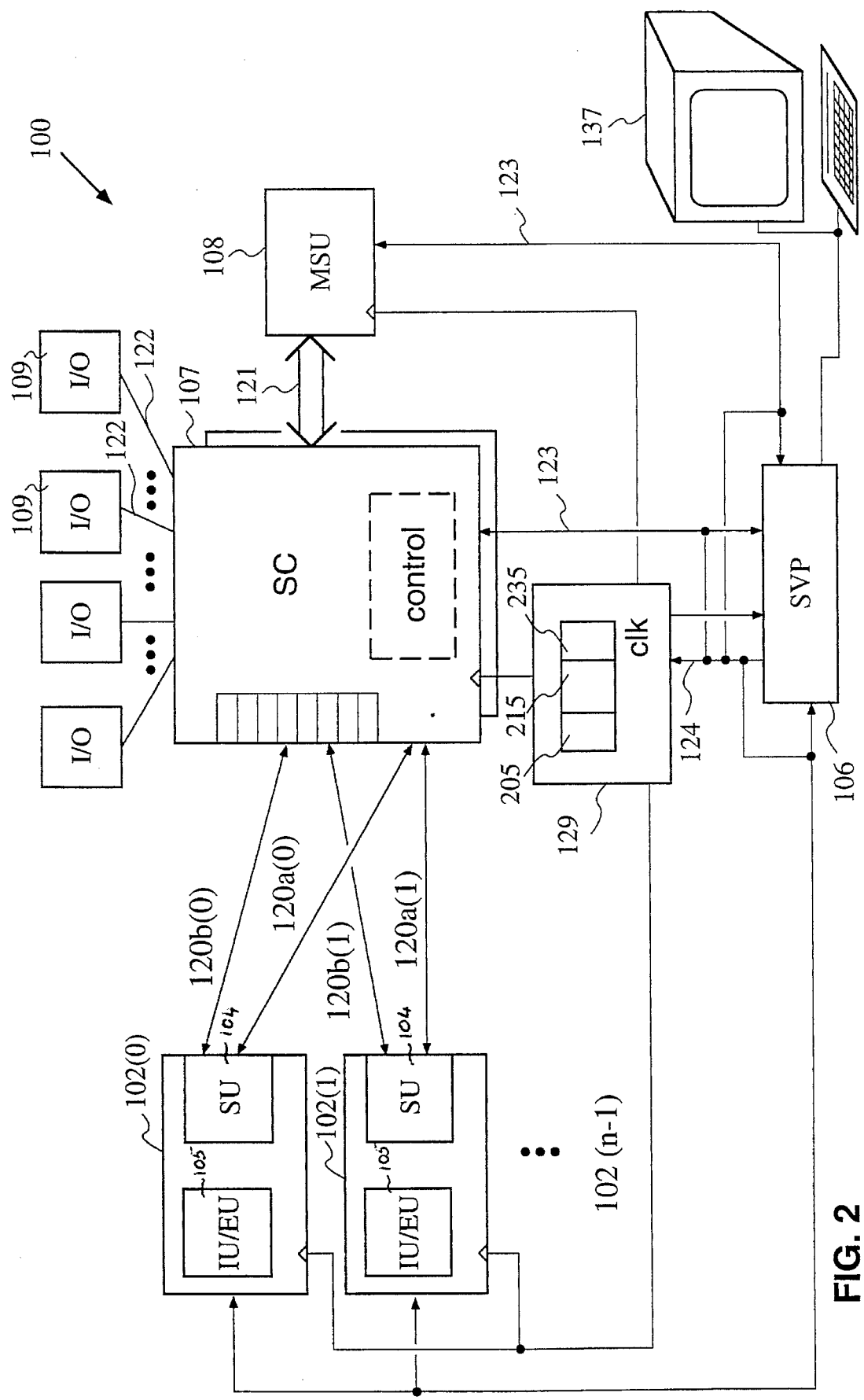
FIG. 2 is a block diagram of a multi-CPU data processing system.

The present invention is particularly suited for application in a data processing system or a large scale data processing system. For that reason, an overview of such a system is presented with reference to FIG. 2, followed by a detailed description of the present invention within such a system.

Referring to FIG. 2, a multi-CPU data processing or computer system 100 is shown. The system 100 includes a plurality of central processing units 102 (0) to 102 (n–1), each having a storage unit 104 with a cache, an instruction unit 105, and an execution unit (shown integrated into the instruction unit), according to the present invention. The storage units provide fast access memory to the CPU. The instruction unit provides several known functions which include instruction fetch and the separation of instructions into opcode and operand parts, and controlling the associated registers.

Each of the CPUs is coupled to one or more system control unit 107 (only one is shown) across data lines 120a and control lines 120b. The data lines 120a (0) to 120a (n–1) transmit data to and from the system control unit 107 and the storage unit of each CPU 102. The control lines 120b transmit address, opcodes and control signals between these two entities 107 and 102.

The system control unit 107 includes an interface 121 to a main store unit 108. The system control unit 107 controls the flow of data within the system, which usually includes data flow between the CPUs, main storage unit 108 and a plurality of input/output devices 109 connected to I/O processor controlled channels 122 which are connected to the system control unit 107.

An error servicing unit or "service processor" 106 and the clock control unit (CCU) 129 are coupled to all of the functional units of the computer system 100 by scan interface 123, or otherwise as known in the art. Bidirectional data transfer is provided between the service processor 106 and the clock control unit 129 via line 124 to the clock control unit 129 and line 125 to the service processor 106. Such a configuration permits the scan-out of data indicating a state of the entire computer system by the service processor, without affecting normal operation of the machine. Also, the service processor 106 is able to scan-in data to specific data locations within the functional units of the system.

Each of the functional units of the system 100 contain a plurality of error detection devices. An error detected by one of these devices is bundled within its unit and propagated over interface 123 to both the service processor 106 and to a system clock control unit 129. The clock control circuit 129 is shown as a physically separate unit in FIG. 2, but may be located on one of the functional units such as the system control unit 107. In response to the reception of an error signal over interface 123, a system clock disable signal is generated in the clock control unit 129 to disable the system clock. The propagation of the error signal to the service processor prompts the service processor to begin a recovery algorithm. After processing the error, which includes various recovery procedures and the logging of error information, the service processor sends a signal over line 124 restarting the system clock.

The clock control unit 129 also contains staging latches 205, a cycle counter 215, an "early up" mechanism 235, and clock control 245, among other circuitry, discussed below.

In addition to disabling the system clock-in response to an error signal, the clock control unit 129 may also be configured to disable the system clock in response to an event trigger. An event trigger may be propagated by a probe attached to a particular connection pin or other accessible signal conductor. The event trigger may also be set through scan operations as taught by U.S. patent application Ser. No. 07/994,661, entitled Scan-Based Probing Apparatus and Method, invented by Ino, et al., and filed concurrently herewith.

The clock control unit 129 and the service processor 106 may be accessed through a console 127. Among other features, this permits modification of the speed of the system which normally operates at approximately 100–200 MHz. In some instances, for example, during debugging as discussed below, it may be preferable to decrease the speed of the system clock.

Referring to FIG. 3, a block/schematic diagram of a system clock disabling signal processing circuit 200 is shown. The circuit 200 is preferably located in the clock control unit, but may be located elsewhere. The circuit 200 provides essentially two modes of signal propagation. In a first, a signal is propagated through the staging latches 205, cycle counter 215, early up mechanism 235 and clock control 245 in much the same manner as discussed above with reference to FIG. 1 above. In a second mode, the functional logic is bypassed so that a clock disabling signal stops clocks in the system 100 without the delay induced by the functional logic. The system clock, in the bypass mode, may be set such that an event trigger is propagated to stop clocks in the system 100 in the same clock cycle it was generated in or the next cycle. An overview of the components of the processing circuit 200 is provided first, followed by a functional description.

The input line 201 which may receive an error signal or an event trigger is connected to both the staging latches 205 and to one input of a multiplexer 210. The output of the staging latches 205 is connected to another input of the multiplexer 210. The select for this multiplexer 210 is provided by the bypass mode enable signal which is provided over line 211 from, for example, the service processor 106. The output of the multiplexer 210 is propagated to a cycle counter 215 and to an AND-gate 220. The other input to the AND-gate 220 is the bypass mode enable signal propagated over line 211 which functions as an enable for bypassing the cycle counter 215.

The output of both the cycles counter 215 and AND-gate 220 are fed into clock stop comparison logic 225 which determines when the input signal, either from the bypass mechanism (output of AND-gate 220) or from the cycles counter 215 is equal to a value warranting the issuance of a clocks-off signal. Combinational logic, generally known in the art, is provided for this pseudo-comparison. The output of the comparison logic 225 is bifurcated and connected to both the early-up chain 235 and an AND-gate 230. In bypass mode, the output of the comparison logic 225 is propagated through AND-gate 230 along line 231 to both clock control OR-gate 240 and clock stop OR-gate 250. A signal at OR-gate 250 is propagated through to the clock stop mechanism, whereupon the system clock is immediately disabled.

When the bypass mode is not enabled, the output of the comparison logic 225 is propagated to the early up chain 235. The output of the early-up chain 235 is connected through OR-gate 240 to the clock control 245. The output of clock control 245 is connected to an input of OR-gate 250 and therethrough propagates a clocks-off signal to the clock mechanisms within the system 100.

The signal processing circuit 200 functions generally as follows. Referring to the first mode in which the functional logic is not bypassed, the processing of a system clock disabling signal, whether it be from a generated error signal or event trigger, functions very much as described with reference to FIG. 1. A signal is input to the staging latches 205 and since the bypass mode is disabled, the multiplexer 210 passes the output of the staging latches to the cycles counter 215. The cycle counter 215 contains a set of counters (not shown) whose inputs are connected to signals that indicate certain events in the machine (only one representative connection is shown). The counter can be programmed to count the occurrences of a certain event, the event trigger, or the number of clock pulses after an event has occurred, or to simply count clock pulses. The counters are preset to a certain value and decremented (or incremented) each time an event (or clock pulse, depending on how they are set up) occurs, until they reach a predetermined value, such as zero. The output of the cycle counter 215 may be used to stop the system clock or to stop one or more CPUs 102.

The output of the cycle counter 215 is connected to the comparison logic 225. The comparison logic 225 issues a system clocks-off signal, in one embodiment, when the cycle counter 215 count equals 1. The reason for this is that if the clock is to stop when an event occurs, there would be no clock to decrement the counter to zero. The output of the comparison logic 225 is connected to the early-up mechanism 235.

At the early-up mechanism 235, appropriate processing which normally entails transforming a signal with normal timing to a signal with early timing is performed. An output of the early-up mechanism 235 is propagated through OR-gate 240 to the clock control 245 and on through OR-gate 250 to stop system clocks.

Referring now to the second mode, or "bypass mode," one consideration is that it may be preferable to operate at a reduced speed, though it is not essential. A benefit of running at reduced speed is that the cycle time may be set to be greater than the maximum propagation delay of an event trigger signal propagation path and, thereby a system clocks-off signal can be generated in the same clock cycle as the detection of the error. This is particularly valuable in debugging. In the debugging context, a path from a specified data location to the processing circuit 200 is established and upon the occurrence of the event trigger a clocks-off signal is generated in the same clock cycle. Data propagation within the system is effectively arrested at that moment thereby providing an accurate and a more readily available machine state.

Referring now to implementation of the bypass mode, when the bypass mode is activated, the event trigger signal bypasses the staging latches 205 along line 202 and is propagated through the bypass multiplexer 210. The output of the multiplexer 210 is passed through AND-gate 220 to the comparison logic 225 which generates a clocks-off signal in response thereto. This clocks-off signal is propagated through AND-gate 230 to clock control 245 and through OR-gate 250 to stop the clocks in the system 100.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

That which is claimed is:

1. An apparatus for generating a stop clock signal for stopping a system clock in a data processing system, said apparatus comprising:

first means including:
delay means receiving a first signal and for delaying the first signal to provide a delayed first signal;
evaluation means for receiving the delayed first signal, for evaluating the occurrence of the delayed first signal and for generating an evaluation output signal indicative of the results of evaluating the occurrence of the delayed first signal;
control means for generating a disable clock signal in response to receiving the evaluation output signal;
timing means for adjusting the timing of the received disable clock signal and for providing a time adjusted disable clock signal; and
clock control means for generating a stop clock signal in response to receiving the time adjusted disable clock signal; and a bypass means receiving a mode selection signal and when the mode selection signal indicates a bypass mode for bypassing the delay means and the evaluation means so as to provide the first signal to the control means and for bypassing the timing means and the clock control means so as to generate a stop clock signal directly from a received disable clock signal from said control means of said first means.

2. The apparatus of claim 1 wherein said bypass means comprises:

selection means for receiving the mode selection signal, the first signal and the delayed first signal and for providing as a selected output signal the first signal when the mode selection signal indicates a bypass mode and the delayed first signal when the mode selection signal indicates a normal mode;

first gate means for receiving the selected output signal and the mode selection signal and for gating the first signal to the control means when the mode selection signal indicates the bypass mode; and second gate means for receiving the disable clock signal and the mode selection signal and for gating the disable clock signal as a stop clock signal when the mode selection signal indicates the bypass mode.

* * * * *